United States Patent
Yoo et al.

(10) Patent No.: US 7,550,389 B1
(45) Date of Patent: Jun. 23, 2009

(54) DUAL DAMASCENE METHOD OF FORMING A METAL LINE OF SEMICONDUCTOR DEVICE

(75) Inventors: Chang Jun Yoo, Gyeonggi-do (KR); Ga Young Ha, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/136,904

(22) Filed: Jun. 11, 2008

(30) Foreign Application Priority Data

Apr. 23, 2008 (KR) ............... 10-2008-0037742

(51) Int. Cl.
*H01L 21/311* (2006.01)

(52) U.S. Cl. .................. 438/700; 438/734

(58) Field of Classification Search .......... 438/700, 438/706, 734

See application file for complete search history.

(56) References Cited

U.S. PATENT DOCUMENTS 6,323,121 B1 * 11/2001 Liu et al. ............. 438/633
6,828,229 B2 * 12/2004 Lee et al. ............. 438/638

* cited by examiner

*Primary Examiner*—W. David Coleman
*Assistant Examiner*—Christine Enad
(74) *Attorney, Agent, or Firm*—Ladas & Parry LLP

(57) ABSTRACT

A dual damascene method of forming a metal line of a semiconductor device includes the procedures of: forming, partially annealing, etching, and cleaning. The forming procedure includes forming an SOD (spin-on dielectric) layer on an insulation layer having a contact hole to fill the contact hole. The partially annealing procedure includes annealing the SOD layer to selectively bake portions of the SOD layer which are filled in an upper portion of the contact hole and placed on the insulation layer. The etching procedure includes etching the baked portions of the SOD layer and a portion of the insulation layer to define a trench. The cleaning procedure includes cleaning the resultant structure of the trench and to remove substantially all of the unbaked portion of the SOD layer which remains in a lower portion of the contact hole.

8 Claims, 5 Drawing Sheets

DUAL DAMASCENE METHOD OF FORMING A METAL LINE OF SEMICONDUCTOR DEVICE

CROSS-REFERENCE TO RELATED APPLICATIONS

The present application claims priority to Korean patent application number 10-2008-0037742 filed on Apr. 23, 2008, which is incorporated herein by reference in its entirety.

BACKGROUND OF THE INVENTION

The present invention relates to a method of forming a metal line of a semiconductor device, and more particularly, to a method of forming a metal line of a semiconductor device which uses a dual damascene process.

In fabricating various semiconductor devices, metal lines are generally formed to be subsequently used as electrically connect elements or lines, and contact plugs are generally formed to be subsequently used as vias or as a means for connecting lower metal lines and upper metal lines to each other.

As the semiconductor device becomes more highly integrated, the aspect ratio of a contact hole gradually increases. As a result, a difficulty has arisen in finding a suitable fabrication process for forming these highly resolved metal lines and their corresponding contact plugs or vias.

Materials for the metal line of a semiconductor device typically include aluminum (Al) and tungsten (W). These materials have been used mainly due to their good electrical conductivity properties. Recently, much interest has been directed towards the use of copper (Cu) as a next-generation material for a metal line. Copper exhibits an excellent electrical conductivity along with a corresponding low resistance as compared to using aluminum and tungsten. Therefore using copper can contribute to solving the problems associated with an RC signal delay in the semiconductor devices that are highly integrated and operate at an extremely high speed.

However, copper cannot be easily dry-etched into a wiring pattern. As such, in order to form a metal line using copper, a damascene process is employed. In the damascene process, a metal line is formed by first etching an insulation layer to define a metal line forming region. After completion of the metal line forming region, the metal line forming region is then filed with a copper layer.

The metal line forming region is either formed using a single damascene process or a dual damascene process. When using the dual damascene process, an upper metal line and a contact plug for connecting the upper metal line to a lower metal line can be simultaneously formed. Because the unwanted surface undulations produced due to the presence of the metal line can be removed, a subsequent process can be conveniently conducted when using the dual damascene process.

In the case of using the dual damascene process according to the conventional art, after primarily etching an insulation layer to define a contact hole, a metal line forming region is delimited on the insulation layer including the contact hole using a BARC (bottom anti-reflection coating) layer and a photoresist. A secondary etching then forms a trench which defines where a metal line will be defined in the insulation layer. Finally, a metal is overlain into the trench to subsequently form the metal line which includes the contact plug.

However, in the conventional dual damascene process, as shown in FIG. 1, an oxide residue 130 is likely to remain on the sidewalls of the trench in which the metal line is to be formed. Due to the presence of the oxide residue 130, a defect can be caused in a subsequent process.

In FIG. 1, the reference numeral 100 designates a semiconductor substrate, 110 designates a lower metal line, 120 designates an insulation layer, H designates a contact hole, and T designates a trench.

This defect brought about by the oxide residue 130 can be overcome by conducting the secondary etching as over-etching. However, in this case, because a top attack occurs on the lower metal line, it is difficult to secure an optimum process condition using the standard dual damascene techniques.

SUMMARY OF THE INVENTION

An embodiment of the present invention is directed to a method of forming a metal line of a semiconductor device which can prevent or at least minimize the occurrence of defects that are caused when defining a trench.

Also, an embodiment of the present invention is directed to a method of forming a metal line of a semiconductor device which can increase a process margin by preventing or minimizing the occurrence of a defect from being caused when defining a trench.

In one aspect, a method of forming a metal line of a semiconductor device comprises the steps of forming an SOD (spin-on dielectric) layer on an insulation layer having a contact hole to fill the contact hole; partially annealing the SOD layer and thereby selectively baking only those portions of the SOD layer which are filled in an upper portion of the contact hole and placed on the insulation layer; etching baked portions of the SOD layer and a portion of the insulation layer and thereby defining a trench; and cleaning the resultant structure defined with the trench and thereby removing an unbaked portion of the SOD layer which is filled in a lower portion of the contact hole.

Annealing the SOD layer is conducted at a temperature of about 250~350° C. under a pressure of 400~700 Torr for 30~60 minutes.

Etching the partially baked SOD layer and the insulation layer is conducted by using a dry etching process.

The dry etching process may be conducted using any number of different dry etching gases. One preferred embodiment of the dry etching process is one that uses $C_3F_6$ gas.

The trench is defined to communicate with the contact hole.

Cleaning the trench is conducted through a wet cleaning process.

One preferred embodiment of the wet cleaning process is one conducted using an HF solution.

After the step of removing the unbaked portion of the SOD layer, the method further comprises the step of filling the contact hole and the trench with a conductive layer to form a contact plug and a metal line.

DESCRIPTION OF SPECIFIC EMBODIMENT

In the present invention, when conducting a dual damascene process, an SOD (spin-on dielectric) layer is used.

Through this process, the resultant trenches and holes can be fabricated to be substantially free of oxide residue defects. Accordingly, a lower metal line can be better secured because the process margin can be increased.

It is important to note that when the SOD layer is baked, the baked SOD layer exhibits a dry etch rate similar to that of an oxide layer. In contrast the SOD layer, baked or not, exhibits a wet etch rate considerably different from that of the oxide layer. In the present invention, these different wet and dry etch rates of the SOD layer are exploited in the dual damascene process.

After etching the contact hole an SOD layer is filled in that contact hole. This SOD layer is then partially annealing in such a manner so as to partially bake only the top portions of the SOD layer. By conducting the annealing in this manner, portions of the SOD layer which are filled in the upper portion of the contact hole and those portions of the SOD layer which are on the insulation layer are baked. Whereas portions of the SOD layer in the lower portion of the contact hole remain mostly not baked by this partial annealing process.

Because the baked SOD layer has a dry etch rate similar to that of the oxide layer, top attack on a lower metal line can be prevented or at least minimized when conducting trench etching as a secondary etching technique. Further, the unbaked portion of the SOD layer which exists in the lower portion of the contact hole can be completely removed due to the difference in the etch rate of the SOD layer when the SOD layer is baked and unbaked. Therefore, in the present invention, a contact plug and an upper metal line can be stably formed through the dual damascene process. Thus, in the present invention, a stable process condition can be realized and a process margin can be increased.

Hereafter, an embodiment of the present invention will be described with reference to the attached drawings.

FIGS. 2A through 2G are cross-sectional views for illustrating the corresponding results of implementing the method of forming a metal line of a semiconductor device in accordance with an embodiment of the present invention.

Figure 1:
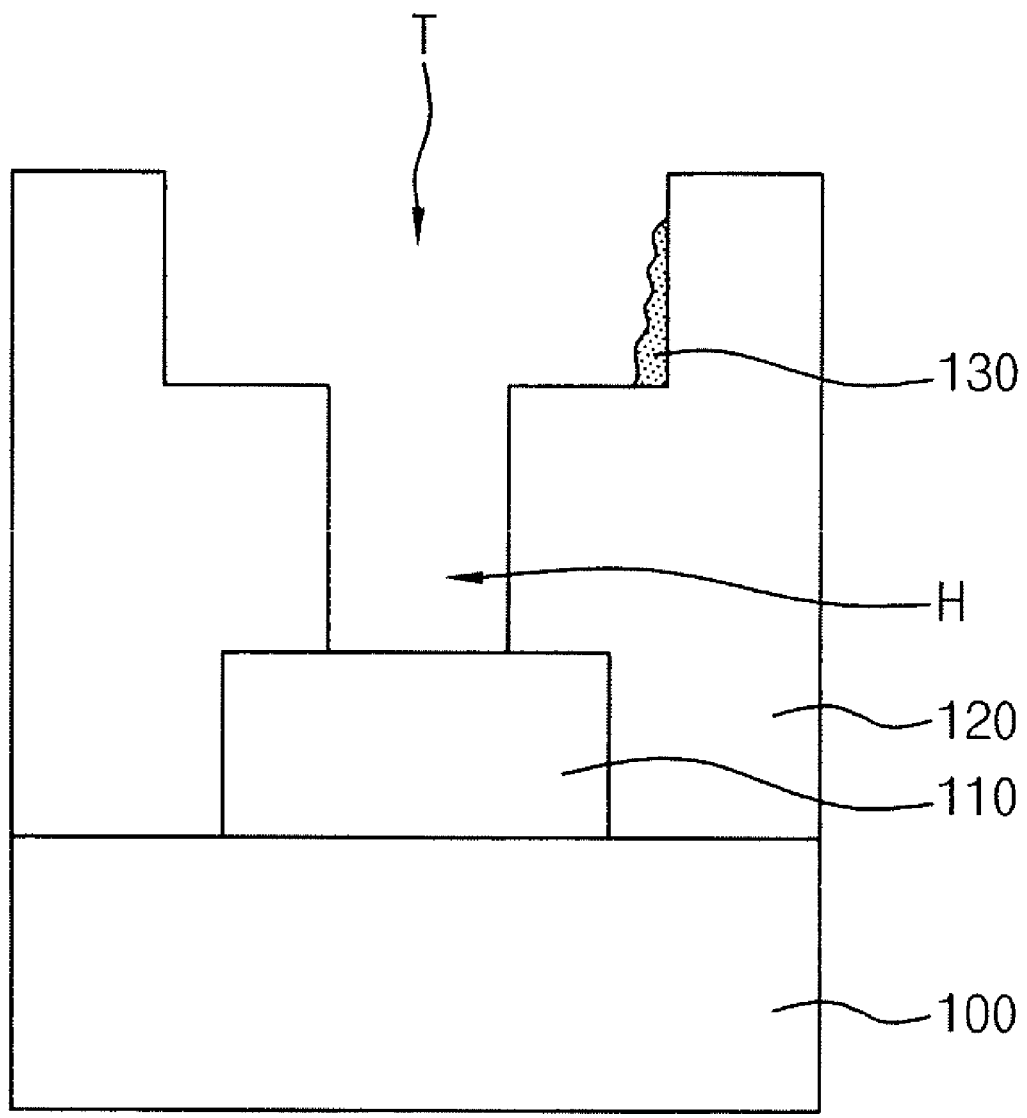
FIG. 1 is a cross-sectional view illustrating an exemplary problem of a conventional art.
Figure 2A:
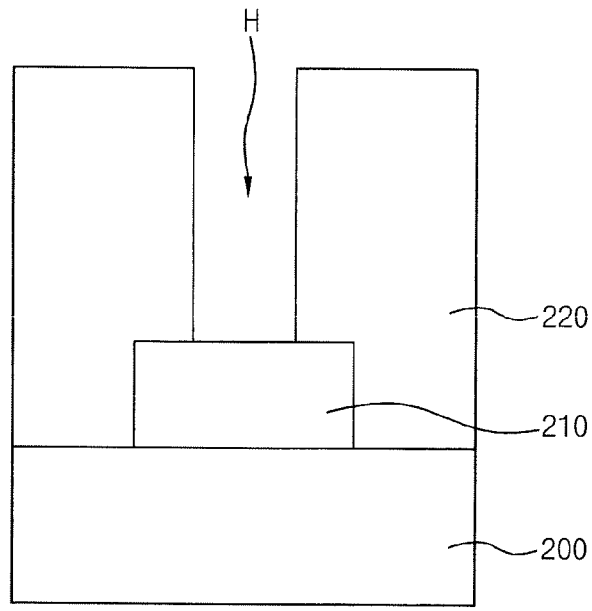
FIGS. 2A through 2G are cross-sectional views illustrating the results of implementing the method of forming a metal line of a semiconductor device in accordance with an embodiment of the present invention.

Referring to FIG. 2A, an insulation layer 220 comprising an oxide layer, for example an HDP (high density plasma) oxide layer, is formed on a semiconductor substrate 200, which is formed with a lower metal line 210, to cover the lower metal line 210. Then, by primarily etching the insulation layer 220, a contact hole H is defined to expose the lower metal line 210. The lower metal line 210 may be made of aluminum and may have a TiN layer formed thereon.

Figure 2B:
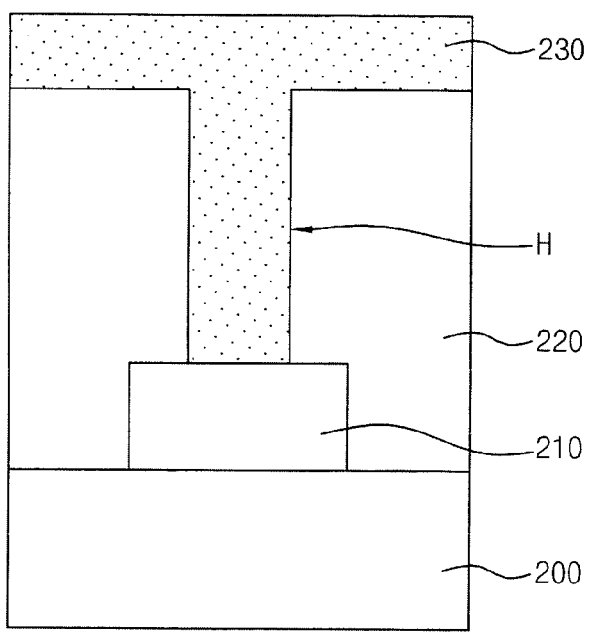

Referring to FIG. 2B, an SOD layer 230 is deposited on the insulation layer 210 which fills the contact hole H. As described above, the SOD layer 230 has a dry etch rate similar to that of an oxide layer regardless of whether or not the SOD layer 230 has been baked. However the SOD layer 230 exhibits a wet etch rate which depends on whether or not the SOD layer has been baked.

Figure 2C:
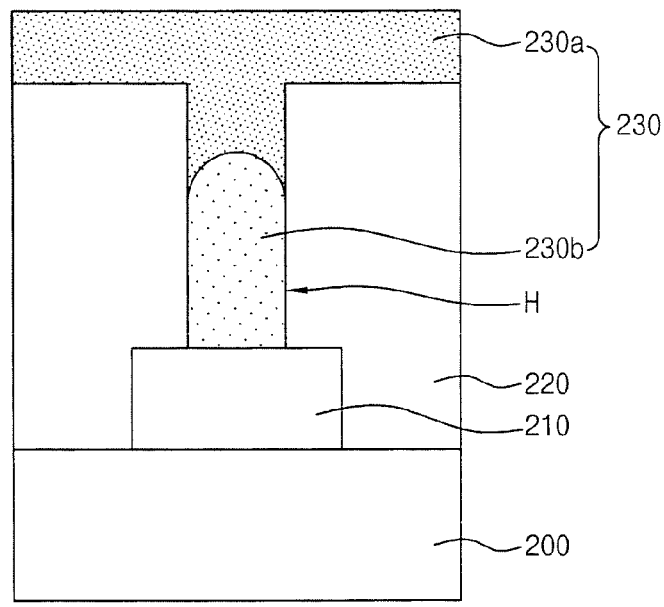

Referring to FIG. 2C, annealing is conducted for the resultant substrate 200 deposited with the SOD layer 230, and through this, the SOD layer 230 is partially baked. Annealing of the SOD layer 230 is conducted at a temperature of 250~350° C. under a pressure of 400~700 Torr for 30~60 minutes. By conducting the partial annealing step on the portions of the SOD layer 230, which are filled in the upper portion of the contact hole H and placed on the insulation layer 210, are baked. In contrast by conducting the is partial annealing step on the portion of the SOD layer 230 filled in the lower portion of the contact hole H is not baked and is maintained as it is deposited. Here, the reference numeral 230a designates the baked portions of the SOD layer 230, and the reference numeral 230b designates the unbaked portion of the SOD layer 230.

Figure 2D:
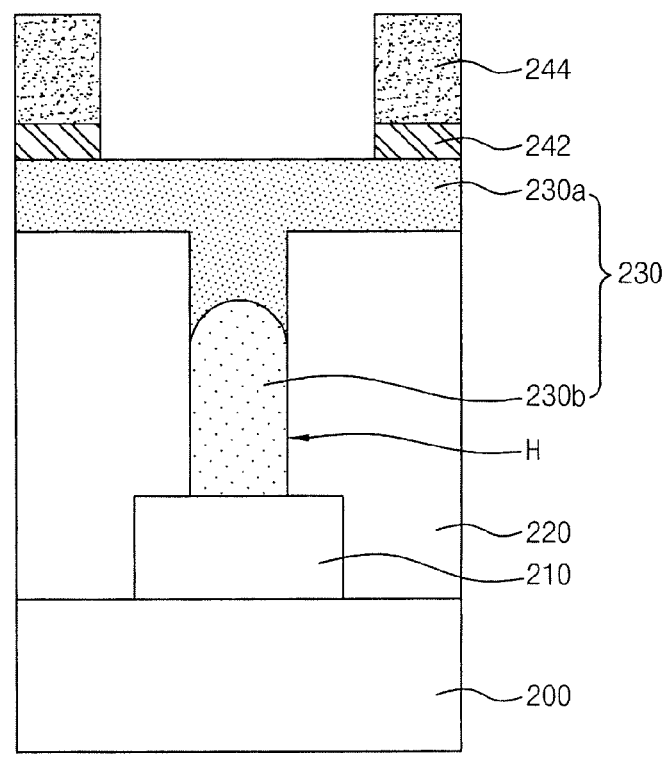

Referring to FIG. 2D, a bottom antireflection coating (BARC) layer and a photoresist layer are sequentially formed on the SOD layer 230. A photoresist pattern 244 is formed by exposing and developing the photoresist layer and then a BARC layer is selectively etched by using the photoresist pattern 244 as an etch mask to form a BARC layer pattern 242 which is used to define the area in which an upper metal line is to be formed.

Figure 2E:
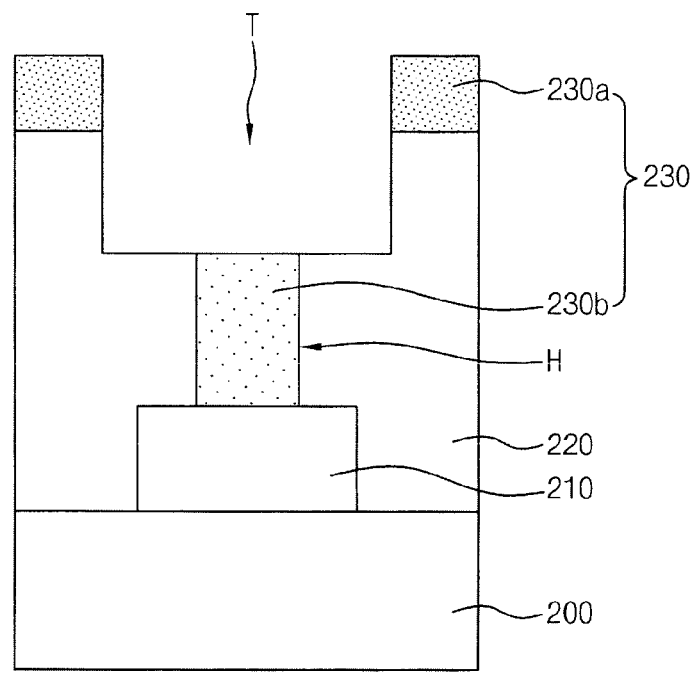

Referring to FIG. 2E, the SOD baked portions 230a of the SOD layer 230 and a partial thickness of the insulation layer 220 are dry-etched using the photoresist pattern 244 and the BARC pattern 242 as an etch mask. The dry etching of the baked portions 230a of the SOD layer 230 and the partial thickness of the insulation layer 220 is conducted using $C_xF_y$ gas, preferably, $C_3F_6$ gas. Since the dry etch rate of the SOD layer 230 is similar to that of the oxide layer ordinarily used in semiconductor manufacturing processes irrespective of whether the SOD layer 230 is baked or not, the baked portions 230a of the SOD layer 230 and the insulation layer 220 comprising an oxide layer are etched at substantially the same rate. As a result, a trench T is defined on the surface of the insulation layer 220 which includes the baked portion 230b of the SOD layer 230 in the form of a line. The trench T is defined to communicate with the contact hole H.

The unbaked portion 230b of the SOD layer 230, which is filled in the contact hole H, is not entirely removed during the dry etching and it subsequently remains as it is.

Figure 2F:
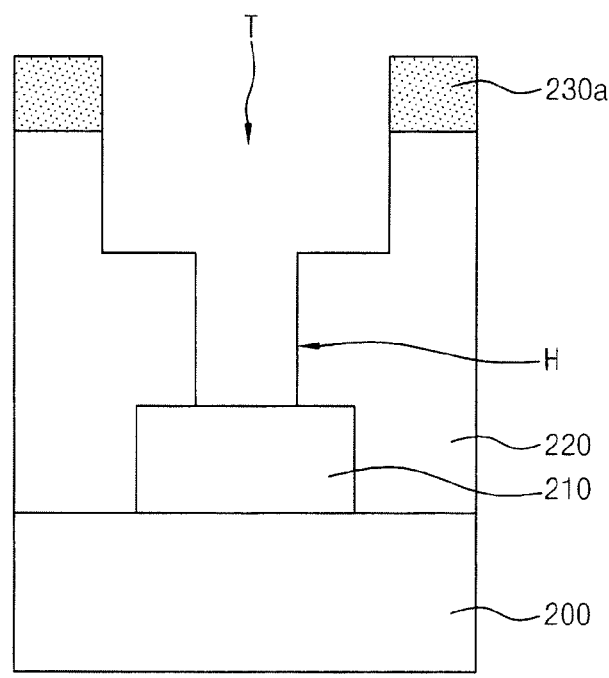

Referring now to FIG. 2F, wet cleaning is conducted for the resultant substrate 200 that defines the trench T using an HF solution. The SOD layer 230 has a wet etch rate that varies depending upon whether the SOD layer 230 is baked or not. For example, unbaked SOD layer 230b exhibits a wet etch rate that is considerably higher than the oxide layer. As a result during the wet cleaning, the unbaked portion SOD layer 230b that remains in the contact hole H is completely removed, whereas the baked portion SOD layer 230a and the insulation layer 220 comprising an oxide layer are almost not etched.

Therefore, in the present invention, only the unbaked portion SOD layer 230b which remains in the contact hole H, can be selectively removed through the wet cleaning without the loss of the baked portion of the SOD layer 230a and the insulation layer 220. Also, in the present invention, it is possible to prevent or at least minimize the occurrence of the oxide residue remaining on the sidewalls of the trench T. Accordingly, since it is not necessary to conduct over-etching in order to remove the oxide residue, then the occurrence of a defect such as a top attack on the lower metal line 210 can be avoided or at least minimized.

Figure 2G:
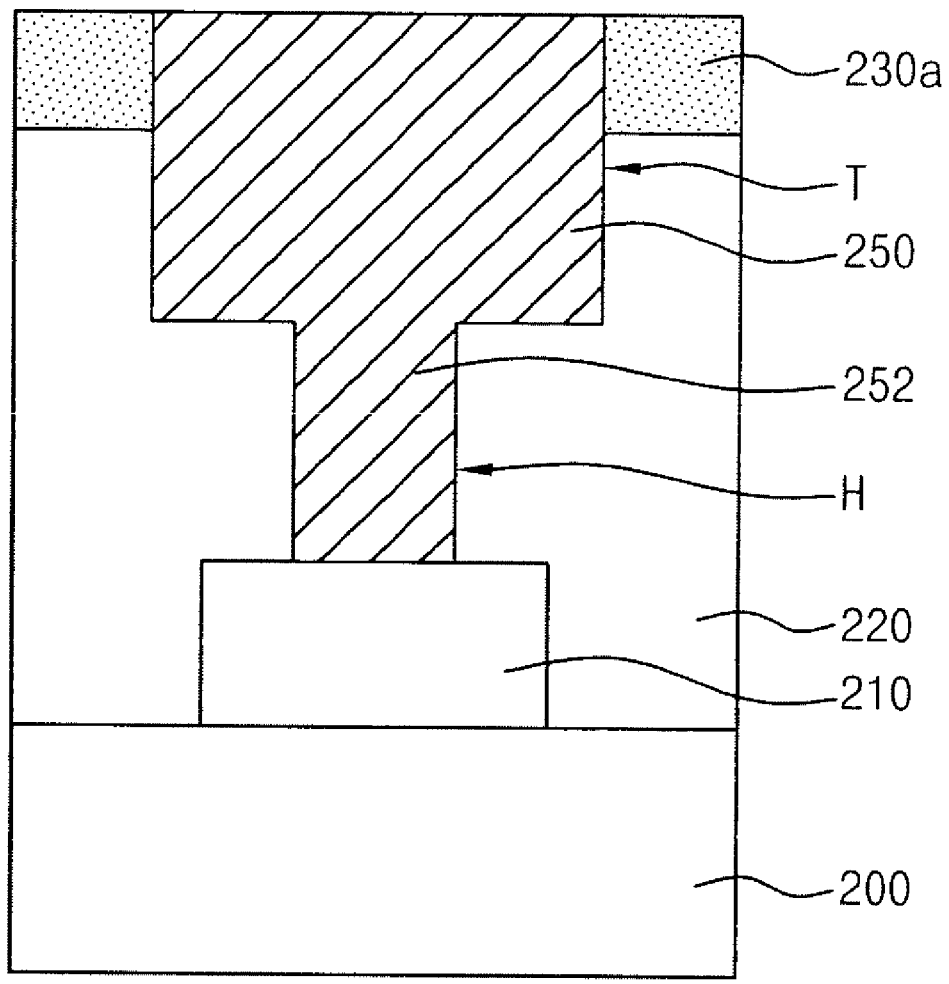

Referring now to FIG. 2G, an upper metal line 250 including a contact plug 252 is formed by depositing a conductive layer which fills the contact hole H and the trench T which is then chemically and mechanically polished (CMP) until the baked portion of the SOD layer 230a is exposed.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A method of forming a metal line of a semiconductor device, the method comprising the steps of:
   forming a spin-on dielectric (SOD) layer to fill a contact hole on an insulation layer of the semiconductor device;
   partially annealing the SOD layer to selectively bake upper portions of the SOD layer which are filled in an upper portion of the contact hole and placed on the insulation layer;
   etching exposed portions of the baked upper portions of the SOD layer to define a trench; and
   cleaning the trench by removing an unbaked portion of the SOD layer which is filled in a lower portion of the contact hole.

2. The method according to claim 1, wherein annealing of the SOD layer is conducted at a temperature of 250~350° C. under a pressure of 400~700 Torr for 30~60 minutes.

3. The method according to claim 1, wherein etching of the exposed portions of the baked SOD layer and the insulation layer is conducted through a dry etching process.

4. The method according to claim 3, wherein the dry etching process is conducted using $C_3F_6$ gas.

5. The method according to claim 1, wherein the trench is defined to communicate with the contact hole.

6. The method according to claim 1, wherein cleaning of the trench is conducted through a wet cleaning process.

7. The method according to claim 6, wherein the wet cleaning process is conducted using an HF solution.

8. The method according to claim 1, further comprising the step of filling the contact hole and the trench with a conductive layer to form a contact plug and a metal line therein, wherein the filling step is performed after the step of removing the unbaked portion of the SOD layer.

* * * * *